United States Patent [19]

Stuckert

[11] 4,417,295
[45] Nov. 22, 1983

[54] AIR JET POWERED COOLING SYSTEM FOR ELECTRONIC ASSEMBLIES

[75] Inventor: Paul E. Stuckert, Katonah, N.Y.

[73] Assignee: International Business Machines Corporation, Armonk, N.Y.

[21] Appl. No.: 412,340

[22] Filed: Aug. 27, 1982

Related U.S. Application Data

[63] Continuation of Ser. No. 3,334, Jan. 14, 1979, abandoned, which is a continuation of Ser. No. 811,755, Jun. 30, 1977, abandoned.

[51] Int. Cl.³ .............................................. H05K 7/20
[52] U.S. Cl. ................................... 361/384; 361/415; 165/123
[58] Field of Search ............... 361/383, 384, 415, 395, 361/399; 165/80 B, 80 D, 122, 123; 174/16 R; 62/414, 418

[56] References Cited

U.S. PATENT DOCUMENTS

| 2,850,242 | 9/1958 | Newton | 165/123 |
| 3,452,811 | 7/1969 | Yerdon | 165/123 |
| 3,626,251 | 12/1971 | Vigue | 361/384 |
| 3,737,728 | 6/1973 | Austin | 361/384 |
| 4,126,269 | 11/1978 | Bruges | 361/384 |
| 4,158,875 | 6/1979 | Tajima | 361/384 |

Primary Examiner—G. P. Tolin
Attorney, Agent, or Firm—Ronald L. Drumheller

[57] ABSTRACT

Air jets are used to entrain ambient air for forced air cooling of electronic components. In the preferred embodiment, individual air jets are associated with each circuit card to entrain and induce flow of a much greater volume of ambient air over each card, thereby cooling it. Modularization and "hot" servicing are facilitated because each circuit card may have its own cooling system, all of which may be powered by a central source of compressed air. The compressed air source may be remotely located resulting in lower noise and more compactness.

6 Claims, 4 Drawing Figures

AIR JET POWERED COOLING SYSTEM FOR ELECTRONIC ASSEMBLIES

RELATED APPLICATIONS

This is a continuation of Ser. No. 003,334, filed Jan. 14, 1979, now abandoned, which is a continuation of Ser. No. 811,755, filed June 30, 1977, now abandoned.

BACKGROUND OF THE INVENTION

1. Field of the Invention

This invention relates to air cooling arrangements for electrical equipment and, more particularly, to an air cooling arrangement for electronic circuit cards wherein compressed air jets induce flow of ambient air for cooling.

2. Description of the Prior Art

Heat is produced whenever current flows, with only the possible exception of current flowing through a perfect conductor. Circuit and component miniaturization technologies are continuously reducing the amount of heat generated by each circuit component or subcircuit assembly, but packing density is increasing so fast that the heat generated per unit area on electronic circuit cards is not decreasing. With current high-performance logic circuits, a significant portion of the total equipment volume is devoted to fans or blowers, ducts, and other components associated with the cooling function.

A typical solution to the cooling problem is to force air through the equipment console. Hot spots still exist with this approach, which results in more sophisticated designs of interior layout or geometry of components and assemblies for optimum cooling. The generally accepted present approach to cooling is to provide multiple path airways through the equipment and to force air through the airways using at least one prime air mover such as a fan or blower. More sophisticated designs arrange the electronic assemblies such as circuit cards so as to channel or subdivide air flow in a predetermined desired manner. The cabinet itself is a part of many forced air cooling systems. As a result, opening a cabinet door and/or removing or repositioning a circuit card disturbs the conventional cooling system. Effective cooling may sometimes be lost to such an extent that thermally induced circuit failure may result if the electrical circuits are in operation. Even when circuit failure does not occur, the thermal environment of operating electrical components has been altered, which may alter circuit operation even though component failure does not occur. As a result, such servicing of equipment while it is "hot" (meaning in operation) is frequently difficult and sometimes impossible.

U.S. Pat. No. 3,626,251 teaches the use of high pressure air streams to direct or control a larger low pressure air stream toward hot spots. A blower is still the prime air mover, not the high pressure air streams, and the cooling system is still greatly disturbed when the servicing door is opened and to some extent also when a circuit board is removed or repositioned.

SUMMARY OF THE INVENTION

It is an object of the present invention to use air jets to entrain ambient air for forced air cooling of electronic components.

Another object is to remotely locate the power source which forces air to move in a forced air cooling system for electronic components.

Still another object is to reduce the noise associated with and the space occupied by cooling apparatus for electronic components.

Yet another object of this invention is to provide a cooling system for electronic components which is aerodynamically and mechanically simple.

A further object is to provide a cooling system for electronic components which is fully operative during "hot" servicing.

It is also an object to provide cooling means which may be mounted on or associated with each electronic assembly or circuit card.

Another object is to provide a cooling scheme for electronic assemblies such as logic cards which imposes minimal constraints on the geometrical arrangement of the assemblies.

The foregoing and other objects, features and advantages of the invention will be apparent from the following and more particular description of a preferred embodiment of the invention, as illustrated in the accompanying drawings.

DESCRIPTION OF THE PREFERRED EMBODIMENT

Figure 1:
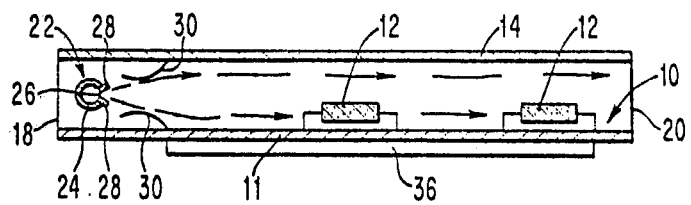
FIG. 1 is a cross-sectional view of a single cooling element in accordance with the present invention.
Figure 2:
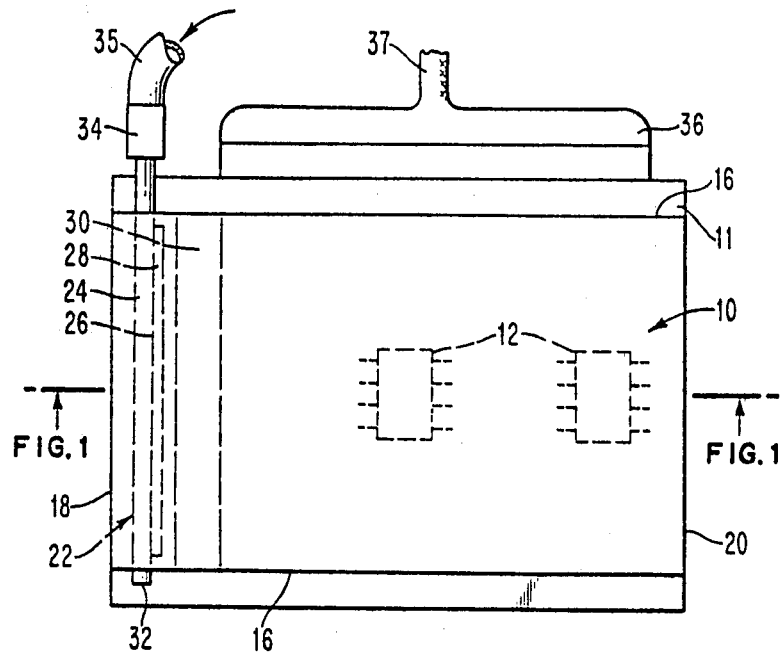
FIG. 2 is a top view of the element of FIG. 1.
Figure 3:
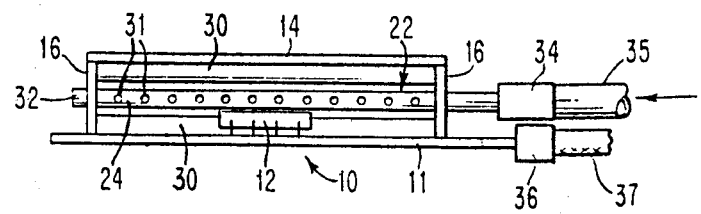
FIG. 3 is an end view of another cooling element showing a more preferred jet nozzle structure.

Referring now to FIGS. 1, 2, and 3, an electronic assembly surface 10 to be cooled is shown as a substantially planar surface 11 with one or more electronic component subassembly structures 12 mounted thereon. Electronic component subassembly structures 12 typically generate heat and need to be cooled. Surface 11 may be the top side of a circuit board or logic card, for example, while structures 12 may be integrated circuits. Surface 11 may itself instead require the cooling or it may require cooling in addition to the structures 12 mounted on it. The electronic assembly surface to be cooled may have many other forms. A second surface 14 opposes the electronic assembly surface 10 and is held in spaced relationship therewith by walls 16. Second surface 14 and walls 16 form an open-ended shroud for surface 10. The shroud and electronic assembly surface 10 in combination form a duct of defined and limited cross-section area. The duct thus formed has an inlet opening 18 which permits ambient air to enter the duct and an outlet opening 20 which permits air to exit from the duct. Except in a region sufficiently close to the jet, substantially the same air pressure exists adjacent both the inlet opening and the outlet opening, which same air pressure is herein defined as ambient.

Within the duct is a nozzle 22 which introduces a jet of high velocity air into the duct which, in turn, induces a flow of ambient air through the duct and over surface 10 thereby cooling surface 10 and the structures 12 mounted thereon. The air jet from nozzle 22 induces a flow of ambient air by creating a pressure difference that has a sucking effect on the ambient air at inlet opening 18. A similar gas pump principle is used in eductors and injectors as well as the gas jet amplifier and jet ejector pump. Here the driving gas is compressed air and the driven gas is ambient air. The compressed air jet entrains surrounding air and thereby brings about a conversion of the potential energy of a relatively small volume of compressed air into kinetic energy of a relatively large volume of mostly ambient air to provide forced air cooling.

Nozzle 22 may be of linear form, and in the alternative, it may comprise an array of discrete nozzles which may or may not be identical. In the one embodiment, nozzle 22 is constructed as a rigid tube 24 having a longitudinal slits 26 for efficiently directing compressed air to the right (FIG. 1) and down the duct. An optional linear venturi 30 may also be positioned as shown to increase the entrainment efficiency of the illustrated jet pump. Nozzle 22 may have many other more or less efficient forms such as a rigid tube with a longitudinal row of small apertures 31 as shown in FIG. 3. Because it is mechanically simple to fabricate a row of small apertures, particularly round apertures, this is the preferred embodiment. The nozzle structure and optional venturi section may be mounted on the card or surface to be cooled as shown in the figures or they may be mounted on a separate structure located adjacent to the cooled surface and its shroud. The jet may be produced anywhere in the duct and even immediately outside the duct if it is sufficiently close to either the inlet opening or the outlet opening to cause the desired flow of ambient air. The jet is considered to be effectively within the duct if it entrains ambient air and thereby induces air flow through the duct. The jet need not be aligned with the duct or centered within the duct. The shroud may be an integral part of the surface structure to be cooled and carried thereon or it may be an adjacent card, a mother board, a cabinet or enclosure wall or door, etc. forming with surface 10 a virtual chamber or effective duct. Side walls 16 may or may not be necessary, depending on the geometrical configuration, aerodynamic and nozzle design, and the cooling requirements. Since the entire cooling structure (less the compressed air source) may be mounted on the cooled surface such as a circuit card much like any other component, this cooling scheme imposes minimal constraints on geometrical arrangement of cooled surfaces. In addition, the cooling structure in each case may be adapted to the cooling requirements of the cooled surface. That is, cards requiring more cooling may have larger ducts and higher air flow due to more, larger, or more efficient air jets.

Figure 4:
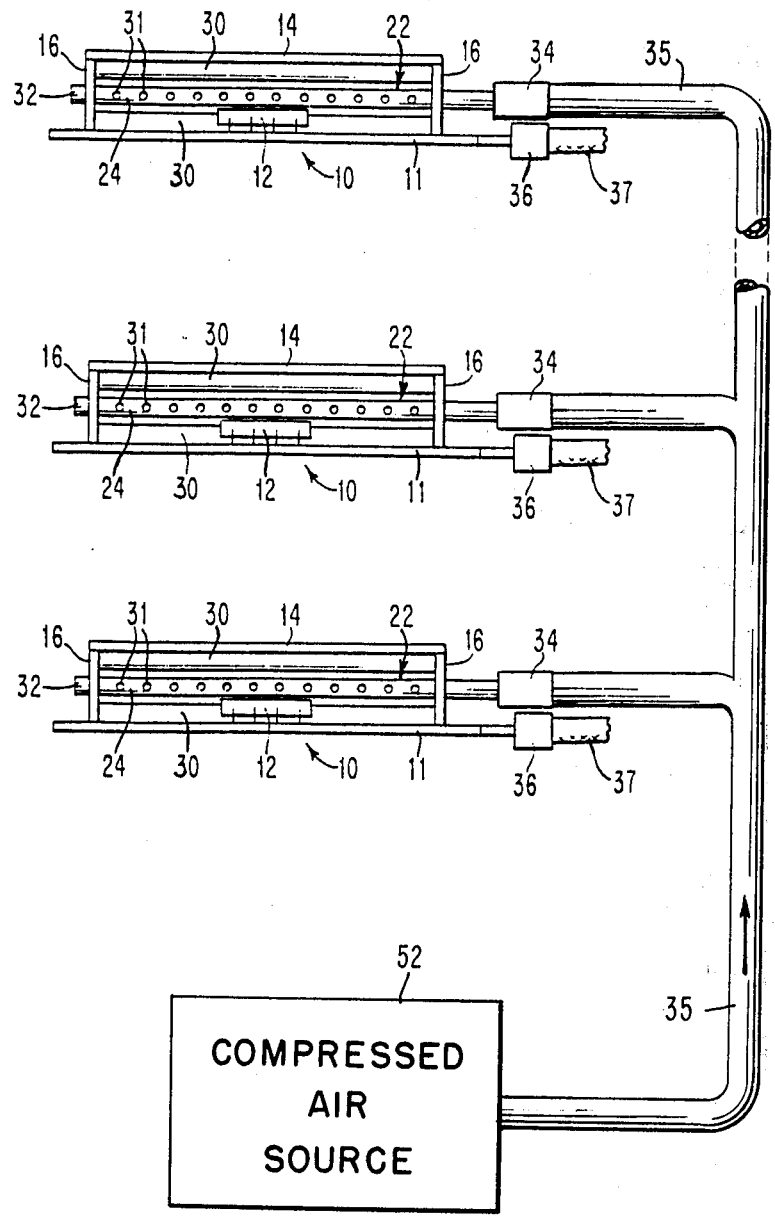
FIG. 4 illustrates a plurality of FIG. 3 elements all connected to a compressed air source.

FIG. 4 illustrates a plurality of FIG. 3 elements all connected to a compressed air source. Tube 24 are each closed on one end 32 and terminate in a connector 34 on the other end, which in turn are attached to a compressed air source 52 (which may be remotely located) via tubing 35. Depending upon cooling requirements, the compressed air may be at an air pressure of as little as a few pounds per square inch (psi) over ambient. Compressed air distribution from a common pressure source 52 to the connectors 34 may be accomplished. If desired with tubing 35 which is flexible and with fittings 34 which are mechanically simple. Low pressure compressed air sources are readily available and are simple in design. Electrical cables 36 electrically interfaces other electrical apparatus with the devices and circuits in and on the cooled surfaces via connectors 37. Air connectors 34 thus supply cooling power to the subassemblies while connectors 36 supply electrical power and signals.

An experimental device was constructed much as shown in the figures except that the venturi section was not included. The duct was 0.5 inches high, 6 inches wide, and 16 inches long. The nozzle was a section of $\frac{1}{8}$ inch diameter tubing with 12 holes of 0.010 inch diameter spaced $\frac{1}{2}$ inch apart center to center in a line. Air velocities were measured at the exit end of the duct where it was found to be substantially uniform across the width of the duct. At the center of the duct exit, the air velocity was 600 ft./min. with approximately 2.5 psig applied to the $\frac{1}{8}$ inch diameter tube. Operation of the experimental device was surprisingly quiet.

While the invention has been particularly shown and described with reference to a preferred embodiment thereof, it will be understood by those skilled in the art that changes in form and details may be made without departing from the spirit and scope of the invention.

What is claimed is:

1. A cooling apparatus and a plurality of circuit cards, said cooling apparatus having cooling air driven only by compressed air and being characterized in that each circuit card carries with it an individual cooling system driven entirely by compressed air, said individual compressed air cooling systems each comprising:
   a shroud mounted on a circuit card, said shroud and circuit card together forming an individual cooling air duct for cooling said circuit card, said cooling air duct having an inlet opening admitting cooling air, an outlet opening exhausting air warmed by said circuit card, and an air flow path connecting said inlet opening to said outlet opening;
   a compressed air nozzle mounted effectively within said individual air duct for common movement therewith and producing an air jet, said air jet driving cooling air along said air flow path; and
   compressed air tubing having an end connected to said compressed air nozzle for providing compressed air to said compressed air nozzle,
   whereby said individual compressed air cooling systems may have different cooling capacities, each adapted to the individual cooling requirements of the circuit card carrying said individual cooling system, and whereby each said circuit card receives forced air cooling regardless of physical position so long as the individual cooling system it carries receives compressed air.

2. Cooling apparatus as defined in claim 1 wherein each said compressed air tubing has another end connected to a common source of compressed air, said common source being remotely located in order to reduce cooling system noise.

3. Cooling apparatus as defined in claim 1 wherein said compressed air nozzle is mounted within said individual cooling air duct.

4. Cooling apparatus as defined in claim 1 wherein said compressed air nozzle comprises a section of rigid tubing having a longitudinal row of small apertures directing multiple air jets along said air flow path.

5. Cooling apparatus as defined in claim 1 wherein said compressed air tubing is flexible.

6. Cooling apparatus as defined in claim 1 wherein the compressed air flow rate through said air nozzle is small in comparison with the flow rate of cooling air driven thereby along said air flow path, the flow of driven cooling air rather than compressed air providing the primary cooling effect along said individual cooling air duct.

* * * * *